(12) United States Patent
Mase et al.

(10) Patent No.: US 10,043,926 B2
(45) Date of Patent: Aug. 7, 2018

(54) METHOD FOR PROCESSING SURFACE OF LIGHT-TRANSMITTING GLASS AND LIGHT TRANSMITTING GLASS PROCESSED BY SAID METHOD

(71) Applicant: FUJI MANUFACTURING CO., LTD., Tokyo (JP)

(72) Inventors: Keiji Mase, Tokyo (JP); Morio Tsukita, Tokyo (JP)

(73) Assignee: FUJI MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/700,644

(22) Filed: Sep. 11, 2017

(65) Prior Publication Data
US 2017/0373203 A1    Dec. 28, 2017

Related U.S. Application Data (62) Division of application No. 14/277,273, filed on May 14, 2014, now Pat. No. 9,793,426.

(30) Foreign Application Priority Data

Jun. 6, 2013   (JP) ................................ 2013-119999

(51) Int. Cl.
    *C03C 15/00* (2006.01)
    *B24C 1/08* (2006.01)
    (Continued)

(52) U.S. Cl.
    CPC .......... *H01L 31/02366* (2013.01); *B24C 1/08* (2013.01); *C03C 15/00* (2013.01);
    (Continued)

(58) Field of Classification Search
    None
    See application file for complete search history.

(56) References Cited

U.S. PATENT DOCUMENTS 3,087,375 A  *  4/1963  Papke ................... G02B 23/14
                                            359/459
8,124,437 B2 *  2/2012  Huang ................... C03C 17/36
                                            257/E31.13

(Continued)

FOREIGN PATENT DOCUMENTS

JP     11-298030    10/1999
JP    2001-189479    7/2001
(Continued)

OTHER PUBLICATIONS

Corresponding Japanese Application No. 2013-119999, Japanese Office action dated Jun. 6, 2016—Cited in parent.

*Primary Examiner* — Shamim Ahmed
(74) *Attorney, Agent, or Firm* — Cooper Legal Group LLC; Ronald Kachmarik (57) ABSTRACT

To impart antiglare properties without reducing the amount of transmitted light, a method for processing a surface of light-transmitting-glass according to the present invention comprises a blasting step of ejecting abrasive grains with particle sizes of #800 to #3000 average particle diameter 14 μm to 4 μm) such as WA (white alundum: high-purity alumina) having higher hardness than that of the glass onto a light-receiving surface of the glass having light-transmitting property to be processed for forming indentations and protrusions in the light-receiving surface of the glass, and after the blasting step, a hydrofluoric acid treatment step of immersing the light-receiving surface of the glass into a hydrofluoric acid solution in 10% to 20% concentration for 30 to 600 seconds thereby increase a height (amplitude) of indentations and protrusions of the surface of light-transmitting-glass.

2 Claims, 6 Drawing Sheets

(51) Int. Cl.
*H01L 31/0236* (2006.01)
*H01L 31/048* (2014.01)
(52) U.S. Cl.
CPC ........ *H01L 31/048* (2013.01); *C03C 2204/08* (2013.01); *Y02E 10/50* (2013.01)

(56) References Cited

U.S. PATENT DOCUMENTS

| | | | | |
|---|---|---|---|---|
| 2011/0020971 A1* | 1/2011 | Sun | ..................... | B01J 19/0046 438/57 |
| 2012/0002290 A1* | 1/2012 | Mase | ................... | G02B 5/0221 359/601 |
| 2012/0043044 A1* | 2/2012 | Mase | ........................ | B22C 9/12 164/6 |

FOREIGN PATENT DOCUMENTS

| | | |
|---|---|---|
| JP | 2003-188399 | 7/2003 |
| JP | 2007-133350 | 5/2007 |
| JP | A2013-201223 | 10/2013 |

* cited by examiner

METHOD FOR PROCESSING SURFACE OF LIGHT-TRANSMITTING GLASS AND LIGHT TRANSMITTING GLASS PROCESSED BY SAID METHOD

RELATED APPLICATION

The present application is a Divisional Application of application Ser. No. 14/277,273, which was filed May 14, 2014. Benefit of priority is claimed from application Ser. No. 14/277,273, and the entire disclosure thereof is incorporated herein by reference.

BACKGROUND OF THE INVENTION

1. Field of the Invention

The present invention relates to a method for processing a surface of light-transmitting-glass and to light-transmitting glass subjected to surface processing with the method, and more particularly relates to a surface processing method suppressing the occurrence of specular reflections at the surface of light-transmitting glass and to light-transmitting glass processed by the said method, in other words the said glass subjected to surface processing with the method.

2. Description of the Prior Art

At present, there is continuously increasing concern society about environmental problems, and the use of energy referred to as "natural energy" or "renewable energy" such as hydroelectric power, wind power, geothermal power, wave power, and sunlight which have a low environmental load is attracting interest.

As part of the use of such natural energy, photovoltaic power generation so called solar power generation in which power generation is performed by using solar energy is extensively used today, photovoltaic modules used in photovoltaic power generation are becoming more widespread.

These photovoltaic modules have a construction in which a required number of photovoltaic cells are connected in series or in parallel and arranged side-by-side then covered by a cover glass such as tempered glass, to form a package.

Accordingly, in cases where the cover glass has a flat surface, unpleasant glare is experienced due to reflected light that is reflected at the surface getting into people's field of vision. Therefore, from the viewpoint of taking into consideration nearby residents, and from the viewpoint of safety in the vicinity of facilities such as ports, airports, roads, etc., photovoltaic modules endowed with antiglare specifications by virtue of the cover glass being subjected to antiglare treatment are becoming widespread.

As examples of such antiglare treatment for the cover glass of a photovoltaic module, a number of technologies designed to reduce glare have been proposed, such as a technology in which reflected light is diffused by attaching a light-diffusing sheet having indentations and protrusions formed thereon to the surface of a cover glass, thereby endowing the cover glass with antiglare properties (Japanese Unexamined Patent Application Publication No. 2001-189479), a technology in which diffuse reflection is generated by forming indentations and protrusions directly in the surface of a cover glass (Japanese Unexamined Patent Application Publication No. HEI 11-298030), or a technology in which the concentration of reflected light in a certain direction is prevented by forming multiple parallel grooves in the surface of a cover glass (Japanese Unexamined Patent application Publication No. 2003-188399).

Figure 6A:
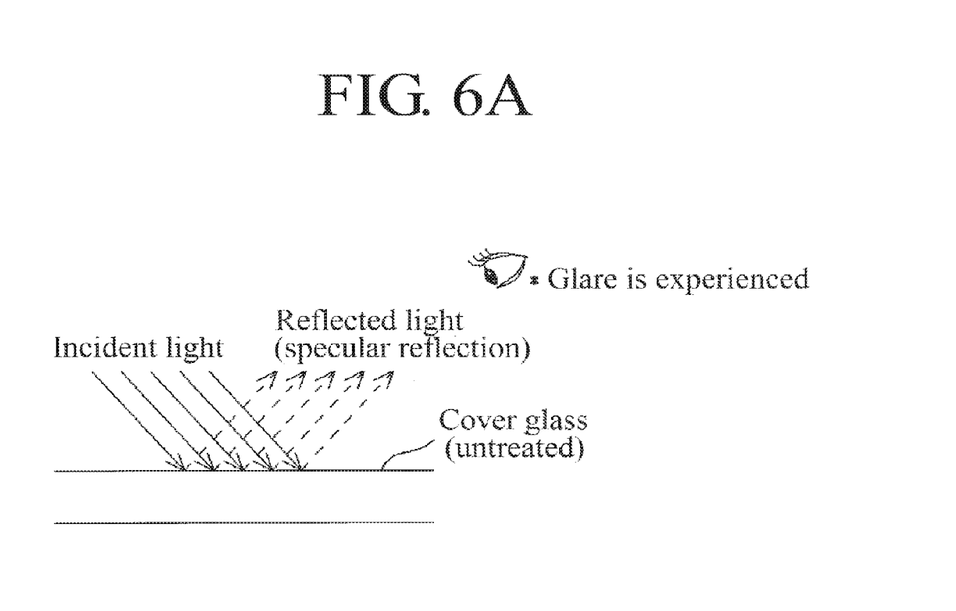
FIG. 6A is a diagram for explaining specular reflection.

The cause of the glare experienced from a cover glass having a flat surface that is not subjected to antiglare treatment is that the reflections occurring at the flat surface of the cover glass are specular reflections shown in FIG. 6A.

In other words, because specularly reflected light is reflected so as to be concentrated in a certain direction in the form of a collimated beam, like sunlight, unpleasant glare is experienced due to the reflected light getting into someone's field of vision a concentrated manner.

Figure 6B:
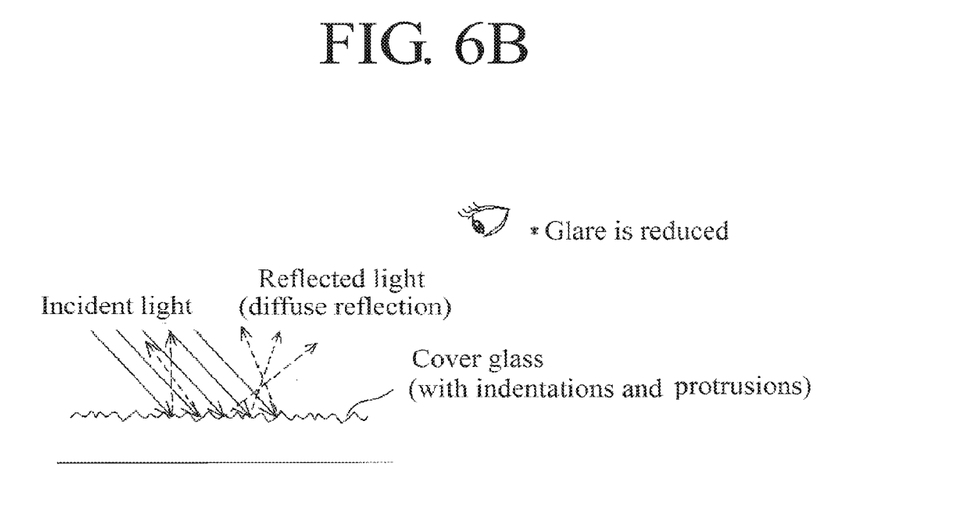
FIG. 6B is a diagram for explaining diffuse reflection.

Therefore, in cases where a light-diffusing sheet having indentations and protrusions formed in the surface thereof is bonded to the surface of a protective cover to diffuse the reflected light as disclosed in the above-cited '479 patent document, or in cases where indentations and protrusions or grooves are directly formed in the surface of a protective cover to cause the reflected light to be diffused, as disclosed in the above-cited '030 and '399 patent documents, because it is possible to avoid concentration of the reflected light in a certain direction as shown in FIG. 6B, the glare experienced even in cases where part of the reflected light gets into the field of vision is considerably reduced, and as a result, it is possible to endow the cover glass with an effective antiglare effect by any of these methods.

However, in either case, namely, the case in which the light-diffusing sheet is bonded to the surface of the cover glass as described in the above-cited '479 patent document, or the case in which indentations and protrusions are directly formed in the surface of the cover glass as disclosed in the '030 and '399 patent documents, with a photovoltaic module provided with a cover glass that is subjected to such antiglare treatment, a decrease in electricity generating efficiency is found as compared with a photovoltaic module provided with an untreated cover glass on which antiglare treatment is not performed.

Such a reduction in the amount of generated power is considered to occur because the amount of light incident on the photovoltaic cells provided in a layer underneath is reduced since the amount of light that passes through the cover glass is reduced by subjecting the cover glass to the above-described treatment and electricity generating performance which is an essential requirement of photovoltaic modules has been sacrificed at the expense of adding functions that take into consideration the nearby residents etc., namely, antiglare properties.

The above description has been given by taking the cover glass of a photovoltaic module as an example of an article subjected to antiglare treatment; however, the decrease in performance due to a reduction in the amount of transmitted light as a result of performing the antiglare treatment described above is a problem that occurs not only with the cover glasses of photovoltaic modules, but also, in a similar manner, with light-transmitting glass subjected to antiglare treatment which is provided in various other types of devices and apparatuses, for example, the cover glasses of water heaters using solar heat, transparent panels used in greenhouses etc. for agricultural and horticultural uses, and so forth.

Thus, the present invention has been conceived to eliminate the deficiencies in the conventional technologies described above, and an object thereof is to provide a light-transmitting glass surface processing method that not only avoids a reduction in the amount of light passing through light-transmitting glass, but conversely, increases it, while at the same time endowing the light-transmitting glass antiglare properties, as well as to provide lighting glass provided with antiglare properties and high light-transmitting properties which are achieved by surface processing with the method.

SUMMARY OF THE INVENTION

To achieve the above-described object, a method for processing a surface of light-transmitting-glass according to the present invention comprises the process including:

a blasting step of ejecting abrasive grains with particle sizes of #800 to #3000 average particle diameter 14 μm to 4 μm) such as WA (white alundum: high-purity alumina) having higher hardness than that of the glass onto a light-receiving surface of the glass to be processed having light-transmitting property for forming indentations and protrusions in the light-receiving surface of the glass; and after the blasting step, a hydrofluoric acid treatment step of immersing the light-receiving surface of the glass into a hydrofluoric acid solution in 10% to 20% concentration for 30 to 600 seconds.

In the above method, the blasting step and the hydrofluoric acid treatment step are performed so that, for the indentations and protrusions formed in the light-receiving surface of the glass after the hydrofluoric acid treatment, in numerical value groups obtained by dividing the light-receiving surface of the glass into minute sections each of a prescribed size (for example, 0.2913 μm square sections) and measuring a height from a deepest portion to a highest portion in valleys of the indentations and protrusions in each section, the fraction of numerical values of 4 μm to 9 μm accounts for 90% or higher.

In analysis of a power spectrum obtained by Fourier transforming a roughness curve of the indentations and protrusions formed in the light-receiving surface of the glass by the hydrofluoric acid treatment, the power spectrum of waveform components with wavelengths of 500 nm to 1333 nm in the roughness curve after the hydrofluoric acid treatment is increased relative to the roughness curve after the blasting and before the hydrofluoric acid treatment.

Light-transmitting glass according to the present invention is obtained by blasting in which abrasive grains are ejected onto a light-receiving surface of the glass having light-transmitting property, followed by surface processing in which the glass is immersed in a hydrofluoric acid solution, wherein, for indentations and protrusions formed in the light-receiving surface of the glass after immersion in the hydrofluoric acid solution, in numerical value groups obtained by dividing the light-receiving surface of the glass into minute sections each of a prescribed size and measuring a height from a deepest portion to a highest portion in valleys of the indentations and protrusions in each section, the fraction of numerical values of 4 μm to 9 μm accounts for 90% or higher.

For the Light-transmitting glass, wherein analysis of a power spectrum obtained by Fourier transforming a roughness curve of the light-receiving surface after immersion in the hydrofluoric acid solution, the power spectrum at wavelengths of 500 nm to 1333 nm is 0.1 μm$^2$ or more.

In the light-transmitting glass of the present invention subjected to surface processing by the above-described method, higher light-transmitting property than that of an untreated light-transmitting glass could be obtained, while at the same time imparting antiglare properties by virtue of the indentations and protrusions formed in the surface thereof.

As a result, when the light-transmitting glass of the present invention is used as the cover glass of a photovoltaic module, for example, it is possible to achieve an improvement in the electricity generating performance exceeding 3% at most, compared with a photovoltaic module on which an untreated cover glass is mounted. Therefore, it is possible to provide a surface processing method and light-transmitting glass which can achieve both antiglare properties and an increase in the amount of transmitted light.

BRIEF DESCRIPTION OF THE DRAWINGS

The objects and advantages of the invention will become apparent from the following detailed description of preferred embodiments thereof provided in connection with the accompany drawings in which:

FIGS. 4A and 4B are diagrams for explaining the principle (predicted) of changes in the amount of transmitted light, where FIG. 4A is for the present invention, and FIG. 4B is for a Comparative Example;

FIGS. 6A and 6B are diagrams for explaining reflection at the light-receiving surface, where

DETAILED DESCRIPTION OF THE PREFERRED EMBODIMENTS

A method for processing the surface according to the present invention includes a blasting step of performing blasting on a light-receiving surface of light-transmitting glass to be processed and a hydrofluoric acid treatment step of immersing the surface to be treated in hydrofluoric acid following the blasting step.

The light-transmitting glass to be processed for the method for surface processing according to the present invention is not particularly limited, and besides ordinary glasses such as float glass, for example, glass that is subjected to a specific treatment like tempered glass may be used. Moreover, with regard to the material, it is possible to use various types of known glasses as the processing target, such as soda lime glass, non-alkaline glass, aluminosilicate glass, quartz glass, borosilicate glass, bismuth-based glass, etc., and colored glasses may also be used.

As described above, blasting is performed on the light-receiving surface of the light-transmitting glass to be processed. The blasting is performed by ejecting abrasive grains onto the light-receiving surface of the light-transmitting glass, causing collisions therewith, thus forming indentations and protrusions. By forming indentations and protrusions in advance on the surface to be treated of the light-emitting glass in this way, the profile of the surface indentations and protrusions that are eventually formed by etching via the hydrofluoric acid treatment to be described below is controlled.

The abrasive grains used in the blasting must exhibit a cutting ability on the light-transmitting glass to be processed, and the abrasive grains having a higher hardness than the hardness of the glass to be processed (a New Mohs hardness of about 4.5 to 6.5) are used.

As such abrasive grains, it is possible to use ceramic-based abrasive grains with grid-shapes, for example, alumina (New Mohs hardness: 12), silicon carbide (New Mohs hardness: 13), zircon (New Mohs hardness: 9), etc., and those whose particle sizes in the range #800 to #3000 (average particle diameter 14 µm to 4 µm) are used.

The abrasive grains can be ejected together with a compressed gas such as compressed air by using a known blasting apparatus.

Blasting apparatuses that can be used include, among others, the direct-pressure type in which abrasive grains introduced into a pressurized tank are pressurized and ejected together with a compressed gas, and the suction type in which abrasive grains are merged with a flow of compressed gas and ejected, and either method may be used.

As for the ejecting conditions, the ejection can be performed in a range of conditions employed in general blast processing; for example, ejection can be performed with a ejecting pressure of 0.3 to 0.5 MPa and an ejecting time of about 500 to 600 s/m².

After the light-receiving surface of the light-transmitting glass is subjected to the above blasting step, it is immersed in a hydrofluoric acid solution to increase undulation (amplitude) in the indentations and protrusions formed in the surface by the blasting step.

A 10 to 20% solution is used as the hydrofluoric acid solution used in the hydrofluoric acid treatment, and the treatment is performed for an immersion time in the range of 30 to 600 seconds.

1. Experiment for Confirming Treatment Conditions

Purpose of Experiment

To confirm the blasting conditions and hydrofluoric acid treatment conditions that can impart antiglare properties without the amount of transmitted light.

Experimental Method

Surface processing was performed by performing blasting on the light-receiving surface of a 90 mm×90 mm cover glass of a photovoltaic module by using a direct-pressure type blasting apparatus with a ejecting pressure of 0.5 MPa and the nozzle distance set to 60 mm, followed by etching the light-receiving surface of the cover glass with hydrofluoric acid treatment, and the short-circuit current of the photovoltaic module on which the surface-processed cover glass was mounted was measured.

The blasting was performed on one cover glass (90 mm×90 mm) with two processing times, namely, 6.72 seconds and 13.44 seconds, including overlapping portions (50 mm×90 mm).

During the above surface processing, the treatment conditions (1) to (5) below were varied:

(1) the particle size of the abrasive grains used in the blasting, (2) the processing time for the blasting, (3) the material of the abrasive grains used in the blasting, (4) the hydrogen fluoride concentration in the hydrofluoric acid treatment, and (5) the immersion time in the hydrofluoric acid treatment;

and how the short-circuit current changed was measured, in comparison with the short-circuit current of a photovoltaic module having an untreated cover glass mounted thereto (Comparative Example 1).

In addition, as Comparative Examples 2 to 5, the short-circuit currents of photovoltaic modules on which cover glasses subjected only to blasting but not to subsequent hydrofluoric acid treatment were mounted were also measured.

Experimental Results

The results of the above-described experiments are shown in Tables 1 and 2 below.

TABLE 1

Results of the experiment for confirming treatment conditions (the changes in blasting conditions)

| Sample NO. | Blasting conditions | | | | Hydrofluoric acid treatment conditions | | Increase rate of short-circuit current (%) |
|---|---|---|---|---|---|---|---|
| | Material | Particle Size (#) | Average Particle Diameter (µm) | Processing time (second) | Concentration (%) | Immersion time (second) | |
| Ex. 1 | WA | 800 | 14.0 ± 1.0 | 6.72 | 10 | 60 | 102.55 |
| Ex. 2 | WA | 1000 | 11.5 ± 1.0 | 6.72 | 10 | 60 | 102.52 |
| Ex. 3 | WA | 1200 | 9.5 ± 0.8 | 6.72 | 10 | 60 | 103.16 |
| Ex. 4 | WA | 2000 | 6.7 ± 0.6 | 6.72 | 10 | 60 | 102.45 |
| Ex. 5 | WA | 2000 | 6.7 ± 0.6 | 13.44 | 10 | 60 | 102.45 |
| Ex. 6 | GC | 2000 | 6.7 ± 0.6 | 13.44 | 10 | 60 | 101.91 |
| Ex. 7 | WA | 3000 | 4.0 ± 0.5 | 6.72 | 10 | 60 | 102.06 |
| Ex. 8 | WA | 3000 | 4.0 ± 0.5 | 13.44 | 10 | 60 | 101.82 |
| Ex. 9 | GC | 3000 | 4.0 ± 0.5 | 13.44 | 10 | 60 | 101.87 |
| Comp. Ex. 1 | — | — | — | — | — | — | 100.00 |
| Comp. Ex. 2 | WA | 800 | 14.0 ± 1.0 | 6.72 | — | — | 99.48 |

TABLE 1-continued

Results of the experiment for confirming treatment conditions
(the changes in blasting conditions)

| Sample NO. | Blasting conditions | | | Hydrofluoric acid treatment conditions | | Increase rate of short-circuitcurrent (%) |
|---|---|---|---|---|---|---|
| | Material | Particle Size (#) | Average Particle Diameter (μm) | Processing time (second) | Concentration (%) | Immersion time (second) | |
| Comp. Ex. 3 | WA | 1200 | 9.5 ± 0.8 | 6.72 | — | — | 99.22 |
| Comp. Ex. 4 | WA | 2000 | 6.7 ± 0.6 | 6.72 | — | — | 97.53 |
| Comp. Ex. 5 | WA | 3000 | 4.0 ± 0.5 | 6.72 | — | — | 94.93 |

TABLE 2

Results of the test for confirming treatment conditions
(the changes in the hydrofluoric acid treatment conditions)

| Sample NO. | Blasting conditions | | | Hydrofluoric acid treatment conditions | | Increase rate of short-circuitcurrent (%) |
|---|---|---|---|---|---|---|
| | Material | Particle Size (#) | Average Particle Diameter (μm) | Processing time (second) | Concentration (%) | Immersion time (second) | |
| Ex. 10 | WA | 1200 | 9.5 ± 0.8 | 6.72 | 10 | 30 | 101.59 |
| Ex. 11 | WA | 1200 | 9.5 ± 0.8 | 6.72 | 20 | 30 | 102.33 |
| Ex. 12 | WA | 1200 | 9.5 ± 0.8 | 6.72 | 20 | 60 | 101.66 |
| Ex. 13 | WA | 1200 | 9.5 ± 0.8 | 6.72 | 10 | 120 | 103.02 |
| Ex. 14 | WA | 1200 | 9.5 ± 0.8 | 6.72 | 10 | 180 | 102.77 |
| Ex. 15 | WA | 1200 | 9.5 ± 0.8 | 6.72 | 10 | 300 | 102.51 |
| Ex. 16 | WA | 1200 | 9.5 ± 0.8 | 6.72 | 10 | 600 | 102.20 |
| Comp. Ex. 1 | — | — | — | — | — | — | 100.00 |

In the above results, when comparing the photovoltaic modules on which only the blasting was performed on the cover glass but subsequent hydrofluoric acid treatment was not performed (Comparative Examples 2 to 5) with the photovoltaic module on which the untreated cover glass was mounted (Comparative Example 1), it was confirmed that the short-circuit currents were reduced relative to that of the photovoltaic module on which the untreated cover glass was mounted (Comparative Example 1), in other words, that the amount of received light on the photovoltaic cells was reduced.

Moreover, for such a reduction in short-circuit current, it was confirmed that reduction factor increased as the size of the abrasive grains used decreased.

In contrast, for photovoltaic modules on which cover glasses processed by the method of the present invention were mounted (Examples 1 to 16), for all of them, the short-circuit currents were higher than that of the photovoltaic module on which the untreated cover glass was mounted (Comparative Example 1), an increase in short-circuit current exceeding 3% at most was confirmed. Therefore it was confirmed that the surface processing of the present invention afforded the advantageous effect of increasing the amount of received light on the photovoltaic cells. That is to say, the amount of light transmitted through the cover glass.

From the results in Table 1, in relation to the changes in the blasting conditions, by using WA abrasive grains (white alundum: alumina-based abrasive grains) and GC abrasive grains (green carborundum: green silicon carbide-based abrasive grains) which both have high hardness on the cover glasses to be processed, no large difference was found in the measured short-circuit currents due to differences in the materials of the abrasive grains (see Examples 5 and 6 and Examples 8 and 9).

Also, between the case where the blasting was performed only for 6.72 seconds and the case where the blasting was performed for 13.44 seconds, that is to say, when the processing time was doubled, almost no change in the measured short-circuit currents was found (see Examples 4 and 5 and Examples 7 and 8). Therefore, it was determined that a change in the blasting time has almost no effect on the performance after treatment.

On the other hand, regarding the particle size of the abrasive grains, the percentage increase in the short-circuit current peaked at 103.16% in the example using the abrasive grains with particle size of #1200 (see Example 3), and a slight reduction in the percentage increase in the short-circuit current was found for abrasive particle sizes larger than or smaller than #1200; however, in the entire #800 to #3000 range of particle sizes specified in the present invention, increases in the short-circuit currents compared with that of the photovoltaic module on which the untreated cover glass was mounted (Comparative Example 1) were confirmed.

Note that, the reflectance at an incident angle (relative to the perpendicular) of 5° at the untreated cover glass (Comparative Example 1) measured by using a spectrophotometer was 11%, whereas for the cover glasses of Examples 1 to 16 of the present invention, the reflectances at an incident angle (relative to the perpendicular) of 5° were all 8% or less. Thus it was also confirmed that the cover glasses of Examples 1 to 16 exhibited suitable antiglare properties.

2. Measurement and Evaluation of Surface Condition

Purposes of Experiment

To consider the reason (mechanism) by which the advantageous effect, namely, the increased amount of transmitted light is obtained, by measuring and evaluating the surface condition of the light-transmitting glass (cover glass of the photovoltaic module) subjected to surface processing the method of the present invention.

Measurement and Evaluation Method

The measurements and evaluation below were conducted using a laser microscope (ultra-deep profile measuring microscope, "VK-8500") and analysis software (VK profile analysis software, "VK-H1A7"), both manufactured by Keyence Corporation.

(1) Measurement of Height Distribution of Indentations and Protrusions

An image obtained by acquiring the surface of the cover glass subjected to the surface processing of the present invention with a laser microscope at 1000× magnification was divided into minute sections each having a prescribed size this Example, 0.2913 µm square sections corresponding to one pixel of the image), a histogram was formed based on measurement values obtained by measuring the height in each section (the height obtained with reference to the minimum height $H_{min}$ which is the deepest part in the valleys in the surface having indentations and protrusions, which is defined as zero), and the surface as evaluated using the measured height distribution.

(2) Evaluation Based on Power Spectrum Via Fourier Transformation

A power spectrum of the spatial frequency components (wavelength components) was determined by obtaining a roughness curve of the cover glass surface based on the image acquired by the laser microscope and performing two-dimensional Fourier decomposition the roughness curve.

Measurement Results (1) Height Distribution of Indentations and Protrusions

Figure 1:
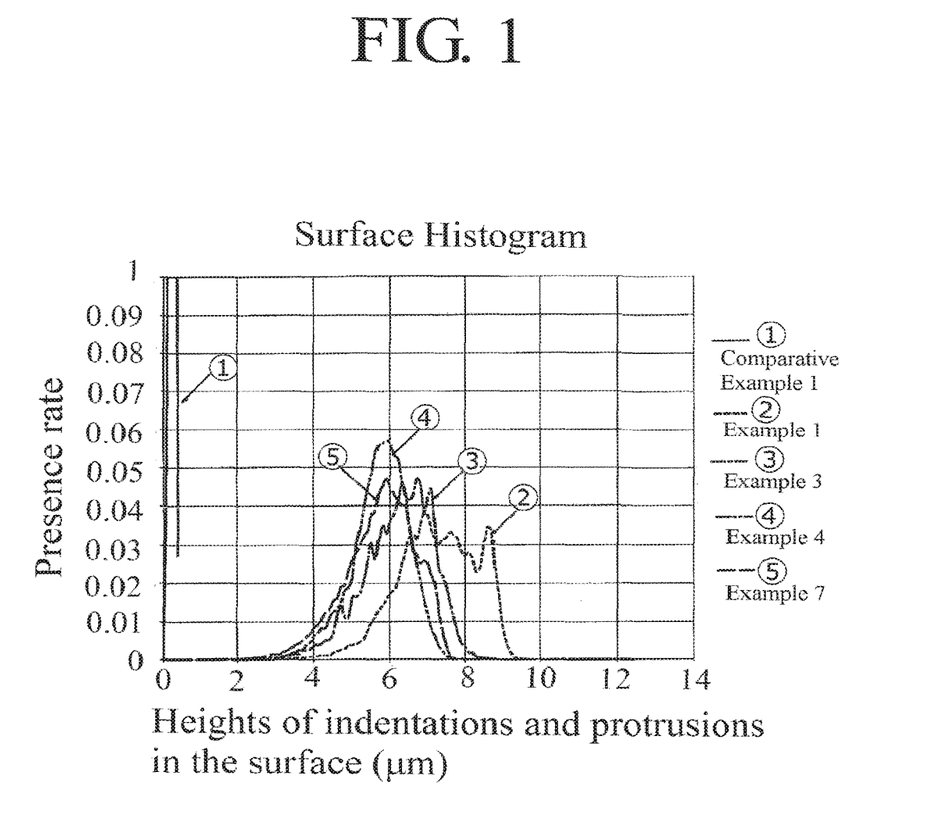
FIG. 1 is a histogram showing the distributions of the measured heights of individual sections obtained by dividing the light-receiving surface of light-transmitting glass into minute sections.

FIG. 1 shows histograms created on the basis of the measurement values obtained by measuring the height of each section with the above-described method. From these histograms, it was confirmed that indentations and protrusions of 4 to 9 µm accounted for 90% or more of the surface of the light-transmitting glass subjected to surface processing using the method of the present invention.

(2) Evaluation Based on Power Spectrum Obtained by Fourier Transformation

Figure 2:
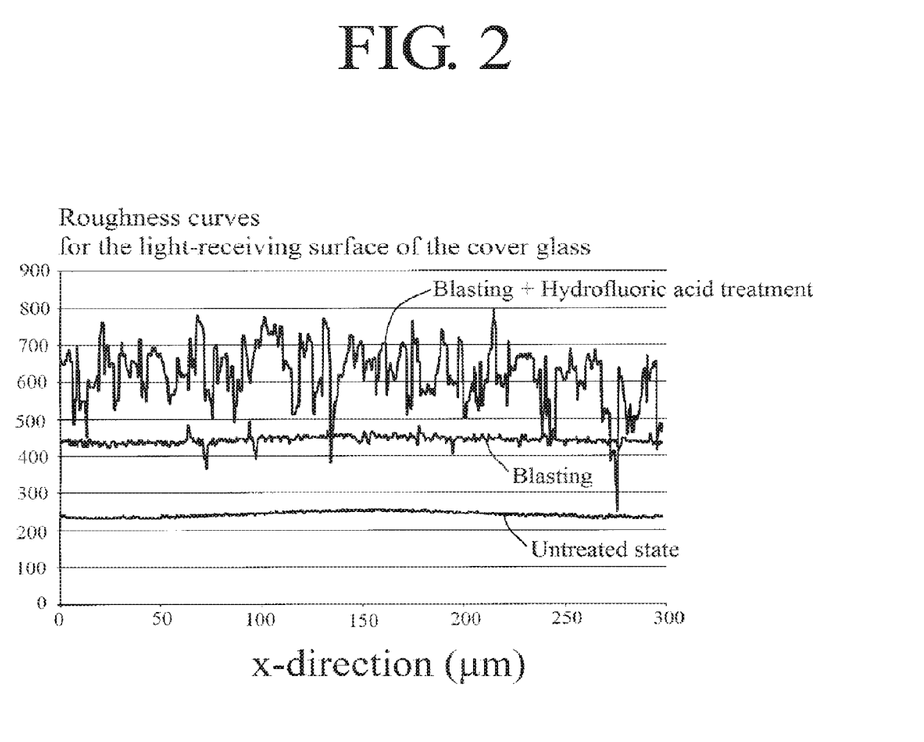
FIG. 2 shows roughness curves for the light-receiving surface of light-transmitting glass in the untreated state, after blasting, and after hydrofluoric acid treatment following the blasting step.

FIG. 2 shows roughness curves of the untreated cover glass (Comparative Example 1), the cover glass subjected to blasting using WA abrasive grains with particle size of #2000 (Comparative Example 4), and the cover glass subjected to a 45-second treatment with 10% hydrofluoric acid after the blasting (Example 17).

Figure 3:
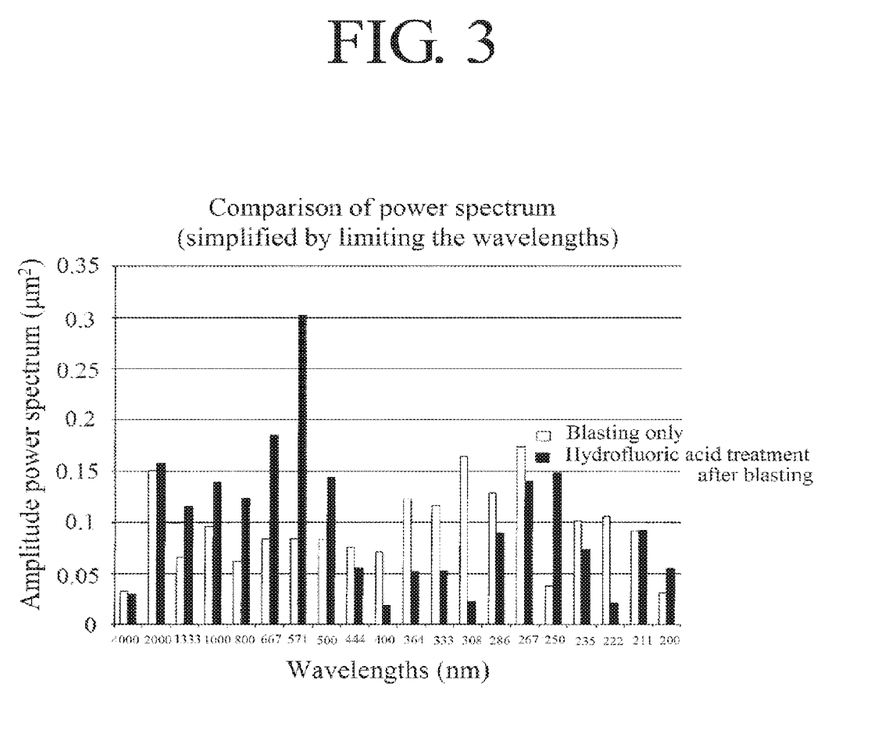
FIG. 3 is a diagram showing the relationship between wavelength and the power spectrum obtained by Fourier transforming the roughness curves after blasting and after hydrofluoric acid treatment following the blasting step.

FIG. 3 shows the results of determining the power spectrum of the spatial frequency components (wavelength components) by performing two-dimensional Fourier decomposition on the roughness curves in FIG. 2 (note that, FIG. 3 has been simplified by limiting the wavelengths displayed).

From the results shown in FIGS. 2 and 3 above, in comparison with the cover glass subjected only to the blasting (Comparative Example 4), for the cover glass subjected to subsequent hydrofluoric acid treatment (Example 17), it was found that the depth of the indentation portions in the indentations and protrusions formed by the blasting eras increased by the etching, and the height (amplitude) of the indentations and protrusions thus increased.

In particular, as shown in FIG. 3, from the power spectrum obtained via Fourier transformation, such an increase in amplitude was found to be remarkable in the wavelength range of 500 to 1333 nm among the waveform components constituting the roughness curve.

Discussion

From the above evaluation results of the surface condition, it is considered that the cover glass subjected to surface processing with the method of e present invention exhibits an increase in the amount of transmitted light due to the following mechanisms.

(1) Discussion Based on Height Distribution of Indentations and Protrusions

For the cover glass processed by the method of the present invention, among the heights of each section measured as described above, heights of 4 to 9 µm accounted for 90% or more.

Figure 4A:
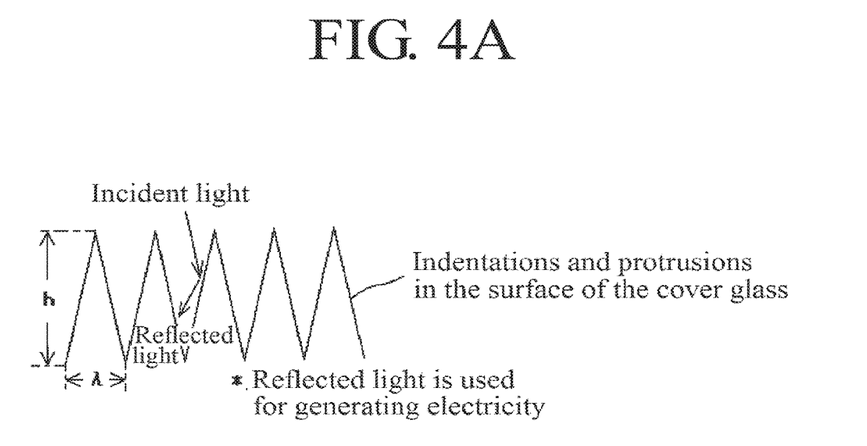

On the other hand, from the roughness curve, because the wavelengths of the waveform components became sufficiently small, namely, half or less of the wave height for the surface of the cover glass after the hydrofluoric acid treatment, as schematically shown in FIG. 4A, the aspect ratio of the wave height (amplitude) h relative to wavelength λ was sufficiently large.

Figure 4B:
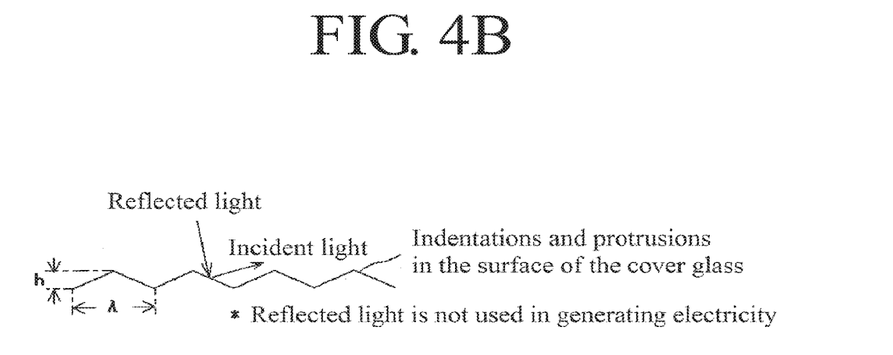

As shown in FIG. 4A and FIG. 4B, even if the cover glass has the indentations and protrusions formed on the light-receiving surface thereof in both cases, with a cover glass in which the indentations and protrusions have a wave height h that is smaller than the wavelength λ as shown in FIG. 4B, almost all of the reflected light is not transmitted through the cover glass and is therefore not used in generating electricity. However, with the structure in FIG. 4A with a large aspect ratio of the wave height h to the wavelength λ of the indentations and protrusions, reflected light that is directed downward as shown by the arrow in the figure, or towards the neighboring peak portion is easily generated, and it is thus possible to produce reflected light that will pass through the cover glass. Accordingly, the reflected light that is not used for generating electricity in the conventional art can also be used for generating electricity, thereby presumably an increase in short-circuit current occurs.

Figure 5:
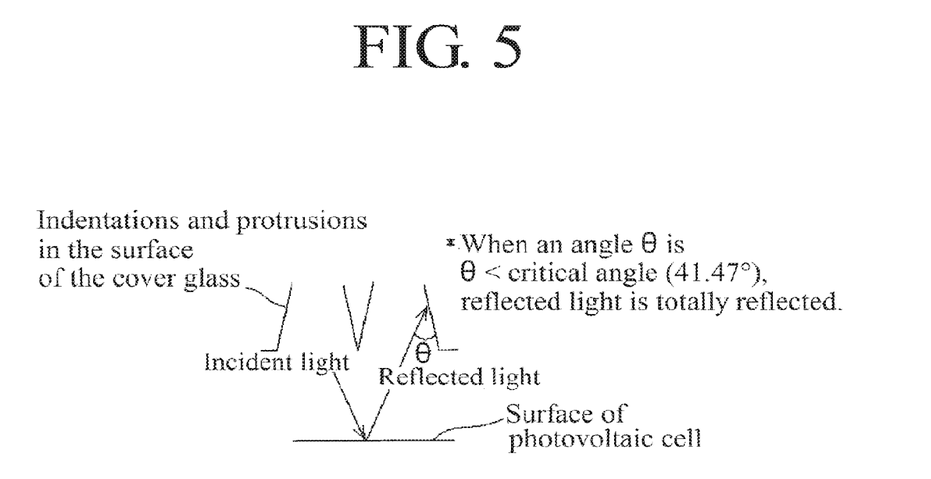
FIG. 5 is a diagram for explaining the principle (predicted) of confinement of light transmitted through the cover glass.

In addition, as shown in FIG. 5, it assumed that part of the light that is transmitted through the cover glass and reaches the solar battery cells arranged in the layer therebelow is reflected at the surface of the solar battery cells, and transmitted through the cover glass again, thus escapes to the outside. However, the light that re-enters the cover glass in this way is incident on the inclined surface of the protrusion part at an angle θ which is an acute angle. The critical angle Io at the interface between the glass which has a high refractive index (a refractive index of 1.51 for soda lime glass) and the air which has a low refractive index (refractive index of 1) is given by $Io=\arcsin(1/1.51)\approx 41.47°$.

Therefore, most of such reflected light is totally reflected at the interface between the glass and air so as to be confined without emerging from the cover glass, and therefore contributes to an improvement in electricity generating efficiency.

(2) Discussion Based on Fourier Transformation

Moreover, as shown in FIG. 3, from the power spectrum obtained by the Fourier transformation, for the cover glass subjected to hydrofluoric acid treatment following the blasting step, an increase in the power spectrum in the wavelength region 500 nm to 1333 nm was confirmed, and it was found that the waveform components at these wavelengths in the roughness curve increased.

Here, diffuse reflection of light occurs when the roughness of the reflecting surface is the same extent of magnitude as the wavelength of the light, or greater, and in sunlight, the region where the intensity is highest, that is to say, in the visible light region which is the region that contributes most to electricity generation, is about 400 nm to 700 nm.

Therefore, with the cover glass subjected to surface processing via the method of the present invention, in the roughness curve, wavelength components that are the same extent of magnitude as or somewhat larger than the visible-light wavelengths are higher. Thus, it is considered that the cover glass is provided with the most appropriate surface conditions for capturing sunlight via the above-described principle.

3. Differences in Advantageous Effect by Processing Light-Receiving Surface/Rear Surface Purpose of Experiment To confirm what kind of difference occurs in terms of advantageous effect between the cases where the light-receiving surface and the rear surface of the cover glass are subjected to the surface processing of the present invention.

Expected Advantageous Effect and Experimental Method

In a photovoltaic module to which a cover glass subjected to surface processing with the method of the present invention is mounted, when it is assumed that an improvement in electricity generating efficiency is obtained by the principle described above, the surface processing of the present invention must be performed on the light-receiving surface of the light-transmitting glass, and when the surface processing of the present invention is performed on the rear surface of the cover glass (the surface on the opposite side from the light-receiving surface), it is expected either that the electricity generating efficiency does not change or that the electricity generating efficiency decreases.

Therefore, cover glasses whose surface on the opposite side from the light-receiving surface was subjected to surface processing by the method of the present invention were mounted to a photovoltaic module, and the short-circuit currents were measured.

Experimental Results

Table 3 shows the surface processing condition and the ratio of short-circuit currents relative to that of a photovoltaic module provided with an untreated cover glass.

TABLE 3

Results of surface processing performed on the rear surface of the cover glasses

| | Blasting conditions | | | Hydrofluoric acid treatment conditions | | Increase rate |
| | | | Average | | | of short- |
| Sample NO. | Material | Particle Size (#) | Particle Diameter (μm) | Processing time (second) | Concentration (%) | Immersion time (second) | circuitcurrent (%) |
|---|---|---|---|---|---|---|---|
| Comp. Ex. 1 | — | — | — | — | — | — | 100.00 |
| Comp. Ex. 6 | WA | 1200 | 9.5 ± 0.8 | 6.72 | 20 | 45 | 99.66 |
| Comp. Ex. 7 | WA | 1000 | 11.5 ± 10.0 | 6.72 | 20 | 60 | 99.58 |
| Comp. Ex. 8 | WA | 2000 | 6.7 ± 0.6 | 6.72 | 10 | 60 | 98.08 |
| Comp. Ex. 9 | WA | 2000 | 6.7 ± 0.6 | 6.72 | 10 | 90 | 98.03 |

As is clear from the results in Table 3, when the method for surface processing according to the present invention was perforated on the rear surface of the cover glasses, it was confirmed that decreases in the short-circuit currents in comparison with the case of the untreated cover glass occurred.

From the above results, it was confirmed that the surface processing of the present invention is effective when performed on the light-receiving surface of the light-transmitting glass.

Thus the broadest claims that follow are not directed to a machine that is configured in a specific way. Instead, said broadest claims are intended to protect the heart or essence of this breakthrough invention. This invention is clearly new and useful. Moreover, it was not obvious to those of ordinary skill in the art at the time it was made, in view of the prior art when considered as a whole.

Moreover, in view of the revolutionary nature of this invention, it is clearly a pioneering invention. As such, the claims that follow are entitled to very broad interpretation so as to protect the heart of this invention, as a matter of law.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described;

What is claimed is:

1. Light-transmitting glass obtained by blasting in which abrasive grains are ejected onto a light-receiving surface of the glass having light-transmitting property, followed by surface processing in which the glass is immersed in a hydrofluoric acid solution, wherein indentations and protrusions formed in the light-receiving surface of the glass after immersion in the hydrofluoric acid solution having numerical value groups obtained by dividing the light-receiving surface of the glass into sections each of a prescribed size corresponding to one pixel of an image of the light-receiving surface obtained by acquiring the light-receiving surface with a laser microscope and measuring a height from a deepest portion to a highest portion in valleys of the indentations and protrusions in each section, a fraction of heights of 4 μm to 9 μm accounts for 90% or higher in each of the group, so that wavelength of waveform components in a roughness curve becomes half or less of wave height of the waveform components in the light-receiving surface of the glass.

2. The Light-transmitting glass according to claim 1, wherein in analysis of a power spectrum obtained by Fourier transforming a roughness curve of the light-receiving surface of the glass after immersion in the hydrofluoric acid solution, the power spectrum at wavelengths of 500 nm to 1333 nm is 0.1 μm$^2$ or more.

* * * * *

UNITED STATES PATENT AND TRADEMARK OFFICE
CERTIFICATE OF CORRECTION

PATENT NO. : 10,043,926 B2
APPLICATION NO. : 15/700644
DATED : August 7, 2018
INVENTOR(S) : Mase et al.

It is certified that error appears in the above-identified patent and that said Letters Patent is hereby corrected as shown below:

In the Specification

Column 9, Line 31, please insert --(in-- after the word "size" and before the word "this"

Column 10, Line 28, please delete the letter "e" and insert therefore the word --the--

Signed and Sealed this
Sixth Day of November, 2018

Andrei Iancu
*Director of the United States Patent and Trademark Office*